(12) United States Patent
Takeuchi et al.

(10) Patent No.: US 6,963,067 B2
(45) Date of Patent: Nov. 8, 2005

(54) SCANNING ELECTRON MICROSCOPE AND SAMPLE OBSERVING METHOD USING IT

(75) Inventors: Shuichi Takeuchi, Hitachinaka (JP); Mine Nakagawa, Hitachinaka (JP); Mitsugu Sato, Hitachinaka (JP); Atsushi Takane, Mito (JP); Kazutaka Nimura, Nagoya (JP)

(73) Assignees: Hitachi High-Technologies Corporation, Tokyo (JP); Hitachi Science Systems, Inc., Ibaraki (JP)

( * ) Notice: Subject to any disclaimer, the term of this patent is extended or adjusted under 35 U.S.C. 154(b) by 0 days.

(21) Appl. No.: 10/750,838

(22) Filed: Jan. 5, 2004

(65) Prior Publication Data

US 2004/0188611 A1 Sep. 30, 2004

(30) Foreign Application Priority Data

Jan. 6, 2003 (JP) .............................. 2003-000598

(51) Int. Cl.[7] ............................................ G21K 7/00
(52) U.S. Cl. ...................................... 250/310; 250/311
(58) Field of Search ........................ 250/311, 310, 307, 250/396 ML, 396 R

(56) References Cited

U.S. PATENT DOCUMENTS 4,618,766 A * 10/1986 van der Mast et al. ..... 250/311
5,512,747 A * 4/1996 Maeda ........................ 250/310
6,353,222 B1 3/2002 Dotan (Continued)

FOREIGN PATENT DOCUMENTS

| EP | 0566963 | * 10/1993 |
|---|---|---|
| JP | 2001-84944 | 3/2001 |
| JP | 2001-118537 | 4/2001 |
| JP | 2001-344599 | 12/2001 |
| JP | 2002-75263 | 3/2002 |
| JP | 2002-184336 | 6/2002 |

OTHER PUBLICATIONS

A. Muto et al., "Attempts to Improve SEM Image Quality by Special Imaging Feature." Proceedings of the Fifty-Eighth Annual Meeting of the Japanese Society of Electron Microscopy, May 14-16, 2002, pp. 246. English Translation.

(Continued)

*Primary Examiner*—John R. Lee
*Assistant Examiner*—Kalimah Fernandez
(74) *Attorney, Agent, or Firm*—Dickstein Shapiro Morin & Oshinsky LLP

(57) ABSTRACT

The invention provides a sample observation method capable of understanding the three-dimensional shape of a sample in a wider range. The observation method of the invention calculates heights (height differences) in the whole domain of an image, from plural sheets of images of different field-of-view angles, being in focus over the whole image, attained by means of the focal depth expanding function to thereby create a map (Z map) of the height information by each pixel, and displays a three-dimensional image as a bird's-eye view. The method also displays to superpose a Z map attained from image signals reflecting the surface structure on a Z map attained from image signals reflecting the composition information with different colors, which makes it possible to clearly understand the spatial distribution of a substance of unique composition inside the sample.

16 Claims, 13 Drawing Sheets

U.S. PATENT DOCUMENTS 6,538,249 B1 * 3/2003 Takane et al. .............. 250/310
6,653,633 B2 * 11/2003 Takane et al. .............. 250/310
6,838,667 B2 * 1/2005 Tsuneta et al. ............. 250/306

OTHER PUBLICATIONS

M. Sato et al., "Depth of the Field at High Magnifications of Scanning Electron Microscopes." J. Vac. Sci. Technol. B 18(6), Nov./Dec. 2000, pp. 3047-3051.

T. Kogashiwa et al., "Automatic Adjustment Function of Optical Axis, and automatic Expansion Function of Focal Depth." SCAN TECH 2002, Preliminary report, Sep. 2002, pp. 2-6. English Translation.

Norio Baba, "Three-dimensional Automatic Measurement by the Stereoscopic Observation Method." SCAN TECH 2000, Preliminary Report, Sep. 2000, pp. 28-32. English Translation.

* cited by examiner

| h11 | h12 | h13 | h14 | h15 | h16 | ... |
|-----|-----|-----|-----|-----|-----|-----|
| h21 | h22 | h23 | h24 | h25 | h26 | ... |
| h31 | h32 | h33 | h34 | h35 | h36 | ... |
| h41 | h42 | h43 | h44 | h45 | h46 | ... |
| h51 | h52 | h53 | h54 | h55 | h56 | ... |
| h61 | h62 | h63 | h64 | h65 | h66 | ... |
| ... | ... | ... | ... | ... | ... | ... |

FIG.12 A

| a11 | a12 | a13 | a14 | a15 | a16 | ... |
|-----|-----|-----|-----|-----|-----|-----|
| a21 | a22 | a23 | a24 | a25 | a26 | ... |
| a31 | a32 | a33 | a34 | a35 | a36 | ... |
| a41 | a42 | a43 | a44 | a45 | a46 | ... |
| a51 | a52 | a53 | a54 | a55 | a56 | ... |
| a61 | a62 | a63 | a64 | a65 | a66 | ... |
| ... | ... | ... | ... | ... | ... | ... |

FIG.12 B

| b11 | b12 | b13 | b14 | b15 | b16 | ... |
|-----|-----|-----|-----|-----|-----|-----|
| b21 | b22 | b23 | b24 | b25 | b26 | ... |
| b31 | b32 | b33 | b34 | b35 | b36 | ... |
| b41 | b42 | b43 | b44 | b45 | b46 | ... |
| b51 | b52 | b53 | b54 | b55 | b56 | ... |
| b61 | b62 | b63 | b64 | b65 | b66 | ... |
| ... | ... | ... | ... | ... | ... | ... |

FIG.12 C

| c11 | c12 | c13 | c14 | c15 | c16 | ... |
|-----|-----|-----|-----|-----|-----|-----|
| c21 | c22 | c23 | c24 | c25 | c26 | ... |
| c31 | c32 | c33 | c34 | c35 | c36 | ... |
| c41 | c42 | c43 | c44 | c45 | c46 | ... |
| c51 | c52 | c53 | c54 | c55 | c56 | ... |
| c61 | c62 | c63 | c64 | c65 | c66 | ... |
| ... | ... | ... | ... | ... | ... | ... | ns # SCANNING ELECTRON MICROSCOPE AND SAMPLE OBSERVING METHOD USING IT

FIELD OF THE INVENTION

The present invention relates to a sample observation method using a scanning electron microscope and more particularly to a sample observation method suitable for the measurement of a height and the observation of a three-dimensional image in the dimension domain exceeding the focal depth of an electro-optic system.

BACKGROUND OF THE INVENTION

The stereoscopic observation method is a technique that gives a stereoscopic view of an image by combining plural sheets of images of different field-of-view angles in regard to the same field of view, and attains a measurement of the stereoscopic image. The stereoscopic observation method uses a shift of parallax of a corresponding point to attain the stereoscopic shape; however, since it is unable to recognize the shift of parallax satisfactorily in an out-of-focus domain, it is unable to attain the stereoscopic shape, which is a constraint of this method. The method attains the stereoscopic view by observing plural sheets of images measured with the tilt angle of a sample (or beam) varied, separately with right and left eyes by using various techniques.

Patent Document 1:
  JP-A No. 75263/2002

Patent Document 2:
  JP-A No. 184336/2002

Non-Patent Document 1:
  J. Vac. Sci. Technol. B, Vol. 18, No. 6, November/December 2000, Mitsugu Sato and Fumio Mizuno, "Depth of field at high magnifications of scanning electron microscopes."

Non-Patent Document 2:
  Scan Tech 2000, Preliminary Report, Tsuyosi Kohaku, Mitsugu Sato and Jun Takane, "Automatic adjustment function of optical axis, and automatic expansion function of focal depth," pp. 2–5 (2002).

Non-Patent Document 3:
  Scan Tech 2000, Preliminary Report, Norio Baba (Kogakuin University), "Three-dimensional automatic measurement by the stereoscopic observation method."

The constraint of the conventional stereoscopic observation method will be described with FIG. 15, FIG. 16A, and FIG. 16B. FIG. 15 is an explanatory chart viewed from the sectional direction of a sample, which typically illustrates the formation of an image in viewing the scanning electron microscope image stereoscopically. Hereunder, the scanning electron microscope will be abbreviated to the SEM. FIGS. 16A and 16B illustrate images by the SEM when the image is viewed stereoscopically under the condition of FIG. 15, in which FIG. 16A illustrates an image by the SEM when the sample or the incident electron is tilted by +θ degree, and FIG. 16B illustrates an image by the SEM when the sample or the incident electron is tilted by −θ degree.

When irradiating an incident electron 151 to a sample 153 from the +θ tilted direction, the method attains an image 161 on the monitor as illustrated in FIG. 16A. Here on the image 161, the domain corresponding to a domain 155 being in focus, illustrated in FIG. 15, is a domain 163. When irradiating an incident electron 152 to the sample 153 from the −θ tilted direction, the method attains an image 162 on the monitor as illustrated in FIG. 16B. Here on the image 162, the domain corresponding to a domain 154 being in focus, illustrated in FIG. 15, is the domain 163. To synthesize these two sheets of images 161, 162 and make a three-dimensional display of them will make it possible to give a stereoscopic view of the in-focus domain 163 only, and impossible to give a stereoscopic view of the out-of focus domain except the domain 163. Thus, the domain to give a stereoscopic view depends on the depth of focus of the SEM.

The depth of focus of the SEM is given by the following expression (1) (the non-patent document 1).

$$f_d^{min} = 2\sqrt{V_{acc}} R_{min}^2 \qquad (1)$$

Where, $f_d^{min}$ represents the depth of focus, $V_{acc}$ the accelerating voltage, and $R_{min}$ the resolution.

As clearly seen from this expression, the depth of focus of the SEM becomes shallower as the resolution becomes higher. When the depth of focus is shallow, the in-focus domain is narrow. Accordingly, a trial for a stereoscopic view will attain only a part of the stereoscopic shape. The stereoscopic observation method using a recent high-resolution SEM has a narrow domain to give a stereoscopic view; that is, it is unable to attain correct height information only in a part of domain inside an image, which is a problem to be solved. Thus, there has been an earnest demand for the three-dimensional image observation method capable of attaining the stereoscopic shape and height difference distribution of an image to cover the whole domain.

SUMMARY OF THE INVENTION

The invention intends, in answer to this demand, to provide a sample observation method capable of attaining the three-dimensional shape of a sample in a wider range.

The observation method of the invention calculates heights (height differences) in the whole domain of an image, from plural sheets of images of different field-of-view angles, being in focus over the whole image, attained by means of the focal depth expanding function to thereby create a map (Z map) of the height information by each pixel, and displays a three-dimensional image as a bird's-eye view. The method also displays to superpose a Z map attained from image signals reflecting the composition information on a Z map attained from image signals reflecting the surface structure with different colors, which makes it possible to clearly understand the spatial distribution of a substance of unique composition inside the sample.

According to one aspect of the invention, the sample observation method using a scanning electron microscope includes the steps of: irradiating an electron beam to a sample at a first incident angle, and detecting a secondary signal (secondary electrons, reflection electrons, X-rays, etc.) emitted from the sample to capture a scanning electron microscope image of the sample; repeating the step while varying a focus in a step-wise manner, and capturing plural scanning electron microscope images at the first incident angle; irradiating the electron beam to the sample at a second incident angle different from the first incident angle, and detecting a secondary signal emitted from the sample to capture a scanning electron microscope image of the sample; repeating the step while varying a focus in a step-wise manner, and capturing plural scanning electron microscope images at the second incident angle; extracting most in-focus image domains from each of the plural scanning electron microscope images captured at the first incident angle, and creating a first all in-focus image being in focus over the whole image; extracting most in-focus image domains from each of the plural scanning electron microscope images captured at the second incident angle, and creating a second all in-focus image being in focus over the whole image; and observing a stereoscopic view from the first all in-focus image and the second all in-focus image.

Following the step of creating the first all in-focus image and the step of creating the second all in-focus image, the sample observation method of the invention includes the steps of: calculating a distance between corresponding two pixels in the first all in-focus image and the second all in-focus image; calculating height information by each pixel on the basis of the distance between corresponding two pixels and a difference of angle between the first incident angle and the second incident angle; and creating a height map on the basis of the height information by each pixel. When the height map is obtained, a three-dimensional bird's-eye view can be created from the map.

According to another aspect of the invention, the sample observation method using a scanning electron microscope includes the steps of: irradiating an electron beam to a sample at a first incident angle, and detecting first and second secondary signals emitted from the sample to capture a scanning electron microscope image of the sample based on the first secondary signal and a scanning electron microscope image of the sample based on the second secondary signal; repeating the step while varying a focus in a stepwise manner, and capturing plural scanning electron microscope images based on the first secondary signal and plural scanning electron microscope images based on the second secondary signal, at the first incident angle; irradiating the electron beam to the sample at a second incident angle different from the first incident angle, and detecting first and second secondary signals emitted from the sample to capture a scanning electron microscope image of the sample based on the first secondary signal and a scanning electron microscope image of the sample based on the second secondary signal; repeating the step while varying a focus in a stepwise manner, and capturing plural scanning electron microscope images based on the first secondary signal and plural scanning electron microscope images based on the second secondary signal, at the second incident angle; extracting most in-focus image domains from each of the plural scanning electron microscope images based on the first secondary signal, captured at the first incident angle, and creating a first all in-focus image being in focus over the whole image; extracting most in-focus image domains from each of the plural scanning electron microscope images based on the second secondary signal, captured at the first incident angle, and creating a second all in-focus image being in focus over the whole image; extracting most in-focus image domains from each of the plural scanning electron microscope images based on the first secondary signal, captured at the second incident angle, and creating a third all in-focus image being in focus over the whole image; and extracting most in-focus image domains from each of the plural scanning electron microscope images based on the second secondary signal, captured at the second incident angle, and creating a fourth all in-focus image being in focus over the whole image.

The first through fourth all in-focus images obtained may be arranged such that the first all in-focus image and the third all in-focus image are displayed with a first color, and the second all-in focus image and the fourth all in-focus image are displayed with a second color to observe a stereoscopic image.

Further, the sample observation method preferably includes the steps of: calculating a distance between corresponding two pixels in the first all in-focus image and the third all in-focus image; calculating height information of the sample based on the first secondary signal by each pixel, on the basis of the distance between corresponding two pixels in the first all in-focus image and the third all in-focus image and a difference of angle between the first incident angle and the second incident angle; creating a first height map on the basis of the height information of the sample based on the first secondary signal by each pixel; calculating a distance between corresponding two pixels in the second all in-focus image and the fourth all in-focus image; calculating height information of the sample based on the second secondary signal by each pixel, on the basis of the distance between corresponding two pixels in the second all in-focus image and the fourth all in-focus image and the difference of angle between the first incident angle and the second incident angle; and creating a second height map on the basis of the height information of the sample based on the second secondary signal by each pixel.

Further, the sample observation method preferably includes the steps of: creating a first three-dimensional bird's-eye view with a first display color from the first height map; creating a second three-dimensional bird's-eye view with a second display color different from the first display color from the second height map; and displaying to superpose the first three-dimensional bird's-eye view and the second three-dimensional bird's-eye view.

Further, the sample observation method may include a step of calculating a difference of height by each of corresponding pixels in the first height map and the second height map.

In order to vary the incident angle of the electron beam irradiated on the sample, the tilt angle of the sample to the irradiated electron beam may be varied by tilting the sample stage, or without tilting the sample stage, the angle of the irradiated electron beam falling on the sample may be varied by utilizing the deflection action occurring when passing the electron beam off the center of the objective lens of the scanning electron microscope. Tilting the relative angle between the electron beam and the sample by utilizing the deflection action of the objective lens will reduce a shift of the field of view occurring when shifting the sample stage.

According to another aspect of the invention, the scanning electron microscope includes: an electron beam source; an electro-optic system that scans to converge a primary electron beam emitted from the electron beam source on a sample, including an objective lens; an incident angle control means that controls an incident angle of the primary electron beam irradiated on the sample; a detector that detects a secondary signal emitted from the sample by the primary electron beam being irradiated on the sample; an all in-focus image processing means that extracts most in-focus image domains from each of the plural sample images of different focuses of the primary electron beam, and creates an all in-focus image being in focus over the whole image; and a calculation means that calculates height information of the sample by each pixel, on the basis of two all in-focus images created by the all in-focus image processing means at two different incident angles set by the incident angle control means, from the plural sample images of different focuses of the primary electron beam each captured at the two different incident angles.

The incident angle control means may include a deflection means that deflects the primary electron beam at an objective point of the objective lens to make the electron beam fall on off the center of the objective lens.

Further, the scanning electron microscope may include an image display means that displays images, and a means that creates a three-dimensional bird's-eye view from the height information of the sample calculated by the calculation means, so that a created three-dimensional bird's-eye view can be displayed on the image display means.

Further, the scanning electron microscope may include a first detector that detects a first secondary signal and a second detector that detects a second secondary signal as the detector, so that the calculation means is able to calculate the height information of the sample based on the first secondary signal and the height information of the sample based on the second secondary signal. In this case, the first detector may be a secondary electron detector, for example, and the second detector may be a reflection electron detector, for example.

Further, the scanning electron microscope may include an image display means that displays images, and a means that creates a three-dimensional bird's-eye view from the height information of the sample calculated by the calculation means, so as to display a first three-dimensional bird's-eye view created from the height information of the sample based on the first secondary signal and a second three-dimensional bird's-eye view created from the height information of the sample based on the second secondary signal on the display means. Here, it is preferable that the first three-dimensional bird's-eye view and the second three-dimensional bird's-eye view are displayed with different colors.

In the conventional observation method, the domain giving the stereoscopic view is restricted because of the depth of focus of the scanning electron microscope; however, the method of the invention expands the domain to give the stereoscopic image, so that a three-dimensional shape can be attained in a wider rage. Due to insufficiency of the depth of focus, it has been difficult to calculate a height (height difference) from a domain being out of focus; however, a use of the method of this invention will allow calculating the height (height difference) from the whole domain of an image, so that the stereoscopic image can be displayed as a bird's-eye view. Further, by displaying to color-code different secondary signals and displaying to superpose two three-dimensional bird's-eye views, the difference in the height direction between objects displayed by the different signals can easily be measured.

BRIEF DESCRIPTION OF THE DRAWINGS

FIGS. 6A and 6B are typical charts illustrating images in a stereoscopic view using the focal depth expanding function, in which FIG. 6A illustrates a focal depth expanded image by the SEM when the sample or the incident electron is tilted by +θ degree, and FIG. 6B illustrates a focal depth expanded image by the SEM when the sample or the incident electron is tilted by −θ degree;

FIG. 9 is a typical chart explaining a Z map:

FIGS. 10A, 10B, and 10C are charts illustrating an example of the bird's-eye view created on the basis of a Z map, in which FIG. 10A illustrates an image attained by tilting the sample by +θ degree and using the focal depth expanding function, FIG. 10B illustrates an image attained by tilting the sample by −θ degree and using the focal depth expanding function, and FIG. 10C illustrates an image attained by rotating the three-dimensional map created from the images of FIG. 10A and FIG. 10B by 90°;

FIGS. 12A, 12B, and 12C illustrate Z maps, in which FIG. 12A illustrates the Z map of the secondary electron image, FIG. 12B the Z map of the reflected electron image, and FIG. 12C the Z map having height difference information;

FIGS. 13A, 13B, and 13C illustrate an example in which the method of this invention is applied to an observation of platinum catalyst particles (Pt/C), in which FIG. 13A illustrates a stereoscopic image created from a focal-depth-expanded image in the secondary electron mode of the sample, FIG. 13B a stereoscopic image created from a focal-depth-expanded image in the reflection electron mode of the sample at the same position, and FIG. 13C a stereoscopic image having the two images superposed;

FIGS. 16A and 16B are typical illustrations of an image in a stereoscopic view under the condition of FIG. 15, in which FIG. 16A illustrates the image by the SEM when the sample or the incident electron is tilted by +θ degree, and FIG. 16B illustrates the image by the SEM when the sample or the incident electron is tilted by −θ degree.

DETAILED DESCRIPTION OF THE PREFERRED EMBODIMENTS

The embodiment of the invention will be described with reference to the accompanying drawings.

Figure 1:
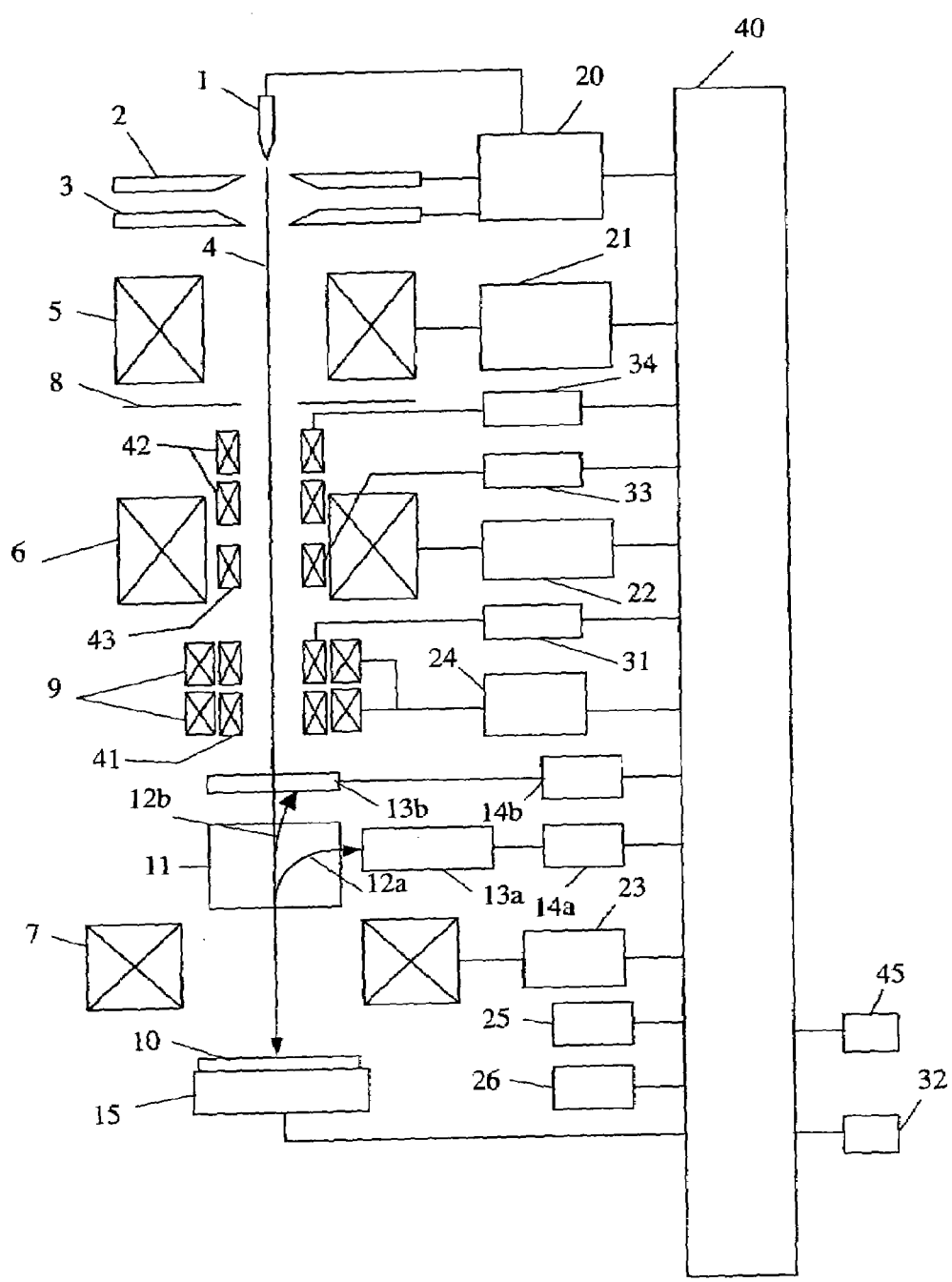
FIG. 1 is a schematic configuration diagram illustrating an example of the SEM according to the invention.

FIG. 1 illustrates a schematic configuration diagram as an example of the scanning electron microscope (SEM) according to the invention. Across a cathode 1 and a first anode 2 is applied a voltage from a power supply for high voltage control 20 controlled by a microprocessor (CPU) 40, whereby a primary electron beam 4 is induced from the cathode 1 in a predetermined emission current. Across the cathode 1 and a second anode 3 is applied an accelerating voltage from the power supply for high voltage control 20 controlled by the CPU 40, so that the primary electron beam 4 emitted from the cathode 1 is accelerated to advance to the following lens system. The primary electron beam 4 is converged by a convergent lens 5 (beam converging means) controlled by a power supply for lens control 21, and unnecessary parts of the primary electron beam are eliminated by a diaphragm 8. Thereafter, the primary electron beam 4 is converged as a minute spot on a sample 10 retained on a sample stage 15, by a convergent lens 6 (beam converging means) controlled by a power supply for second convergent lens control 22 and an objective lens 7 controlled by a power supply for objective lens control 23. The objective lens 7 may take on various configurations such as the in-lens system, out-lens system, or snorkel system (semi-in-lens system). Further, a retarding system is also possible which applies a negative voltage to the sample to decelerate the primary electron beam. Further, each lens may be an electrostatic lens configured with plural electrodes.

A scan coil 9 scans the primary electron beam 4 on the sample 10 two-dimensionally. Secondary signals (sample signals) 12a, 12b of secondary electrons emitted from the sample 10 by the irradiation of the primary electron beam 4 advance above the objective lens 7; thereafter, the signals 12a, 12b are each separated according to the differences of energies by means for establishing orthogonally located electrical and magnetic fields for separating trajectory of secondary signal 11, and advance to the directions of secondary signal detectors 13a, 13b. These signals 12a, 12b are thereafter detected by the secondary signal detectors 13a, 13b. The signals from the secondary signal detectors 13a, 13b each pass signal amplifiers 14a, 14b, and are stored as image signals in an image memory for display 25. Image information stored in the image memory for display 25 is displayed on an image display 26 at any time.

The signal flowing through the scan coil 9 is controlled according to the magnification in observation by a power supply for scan coil control 24. A two-stage deflecting coil 41 is disposed at the same position as the scan coil 9, and when tilting the beam, the deflecting coil 41 is able to two-dimensionally control the position of the primary electron beam 4 falling on the objective lens 7 by a power supply for tilt control 31, so that the object point of the objective lens 7 comes to the deflection point of support. Near the convergent lens 6 is disposed an astigmatism correction coil 43, which is controlled to work with the condition of tilting the beam by a power supply for astigmatism correction 33. A two-stage deflecting coil 42 is disposed between the convergent lens 6 and the diaphragm 8, and the deflecting coil 42 is able to two-dimensionally control the position of the primary electron beam 4 falling on the convergent lens 6 by a power supply for astigmatism control 34, so that the object point of the convergent lens 6 comes to the deflection point of support. Through an input device 45, the operator is able to designate the condition of capturing images (scanning speed, accelerating voltage, etc.) and the condition of tilting the beam (tilt direction, tilt angle), and is also able to designate to output and/or save the images.

The CPU 40 consecutively fetches plural images of different focuses, and calculates the focus control conditions thereof; and an image memory 32 stores them (image building means). The image data stored in the image memory 32 can be fetched from the SEM to the outside. Further, the CPU 40 executes the image processing to the image data in the image memory 32, and synthesizes the data as the image having the depth of focus expanded; and the image memory 25 stores the data to display on the image display 26. The synthesized image (focal-depth-expanded image) can be stored also in the image memory 32, and the synthesized image data can be fetched from the SEM to the outside. Here, the image processing is possible with a program stored in the CPU 40, and the processing can also be implemented at a high speed by means of a dedicated hardware. Since a high-speed image processing is possible with the dedicated hardware, while fetching the consecutive images of different focuses, the CPU 40 is also able to execute a sequential image processing in parallel, and to synthesize images of a large depth of focus.

Further, the image memory 32 is able to store multiple sheets of synthesized images (focal-depth-expanded images); and on the basis of the conditions of tilting the sample or the beam, it is possible to create Z maps, bird's-eye views, and color-coded displays of different signals (each will be described later) with a program stored in the CPU 40. It is also possible to store the created information in the image memory 25 as required, to display them on the image display 26, and to execute the image processing of creating sequential Z maps, bird's-eye views, and color-coded displays of different signals by means of the dedicated hardware.

Figure 2:
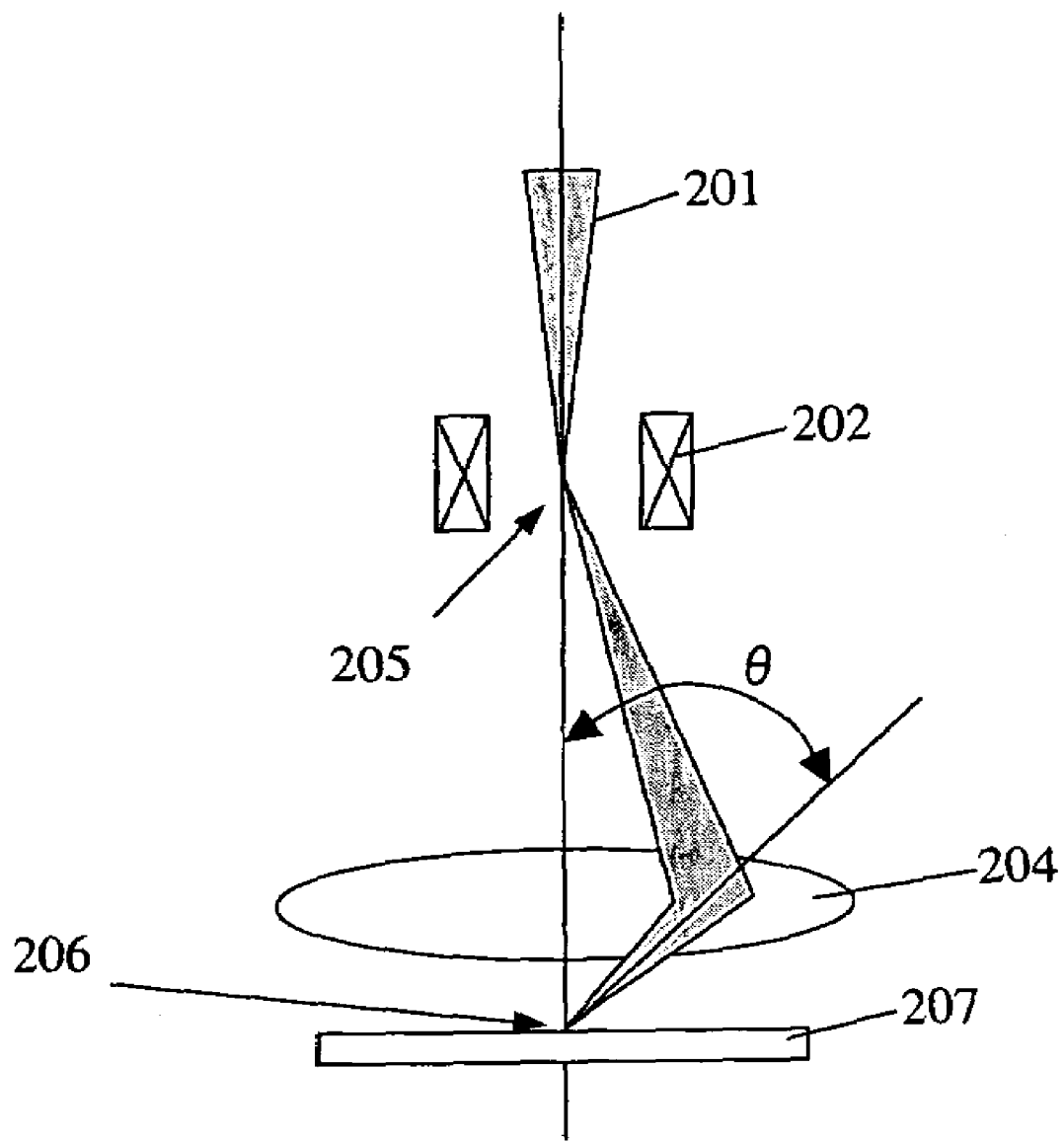
FIG. 2 is an explanatory chart for tilting a beam.

For attaining a tilted image of a sample, a common practice is to slant a sample stage. However, in order to prevent a shift of the view field at a high magnification when the sample stage is slanted, or to attain a tilted image at a higher speed, it is more reasonable to slant a charged particle beam against the sample than to mechanically slant the sample stage. The tilting of the charged particle beam on the sample, using the swing-back action of an objective lens, will be described with a typical chart illustrated in FIG. 2. A deflecting coil 202 deflects a beam 201 at an object point on an objective lens 204, and makes the beam 201 fall on off the center of the objective lens 204, whereby the beam is tilted on a sample 207 by an angle θ owing to the converging action of the objective lens 204. In this case, since a position of an object point 205 viewed from the objective lens 204 does not move, if the beam is tilted, a field of view 206 will not move. In this state, it is only needed to attain the focal-depth-expanded images of different field-of-view angles.

When making a stereoscopic view by capturing plural sheets of images whose field-of-view angles are different, which are in focus on the whole image screen, the stereoscopic observation method uses the focal depth expanding function as a means that captures the images being in focus on the whole image screen (Patent Document 1). The focal depth expanding function is an observation method that captures plural sheets of images of different focuses, executes position corrections and brightness corrections as needed, compares pixel information at the same position of the images, and extracts only the in-focus parts to thereby form a sheet of image.

Figure 3:
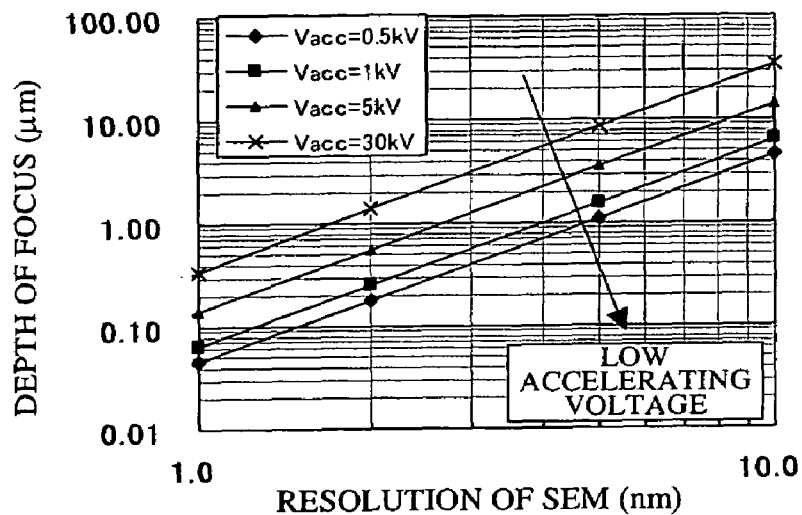
FIG. 3 is a chart illustrating the relation between the resolution and the depth of focus of the SEM in a high magnification.
Figure 4:
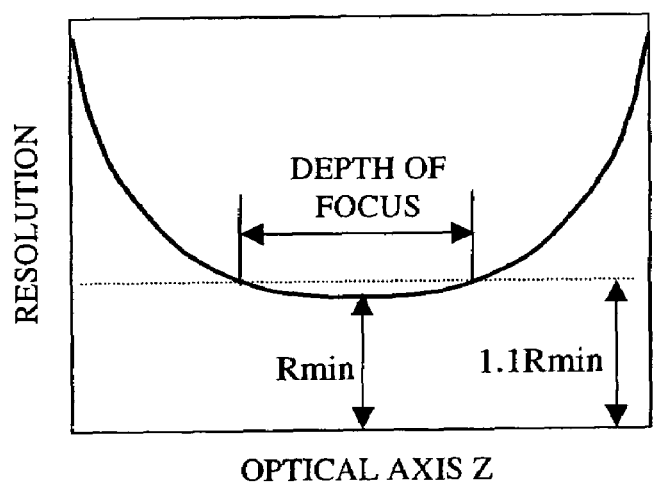
FIG. 4 is a chart illustrating the definition of the depth of focus in a high magnification.

The Field Emission SEM (FE-SEM) intended for high-magnification and high-resolution observations is unavoidable of insufficiency of the focal depth. FIG. 3 illustrates the relation between the resolution and the depth of focus of the FE-SEM in a high magnification. FIG. 3 shows that as the accelerating voltage is decreased and the resolution is increased, the depth of focus becomes shallower. As illustrated in FIG. 4, the depth of focus in a high magnification as mentioned here is defined as a distance (range) in the Z-direction, in which the resolution is maintained at 1.1 times of the highest resolution $R_{min}$ or lower in the variations of resolution to the optical axis Z near the focus point.

The automatic expansion function of focal depth calculates the depth of focus in the current SEM condition in the first place, varies the focus by the depth of focus, and attains the SEM image. Here, the breadth of varying the focus in each image is made equal to the depth of focus of the SEM. When comparing plural images of different focus positions at the same part on the sample, the method detects the image that is most in focus at the pixel level through the image processing, and selects the pixels of the image at that moment. While executing this processing over the whole field of view of the SEM image, and finally joining up the pixels selected by the method so as to make a sheet of image, the method builds up the SEM image (focal-depth-expanded image) being in focus in the whole image (Non-patent Document 1, 2).

Figure 5:
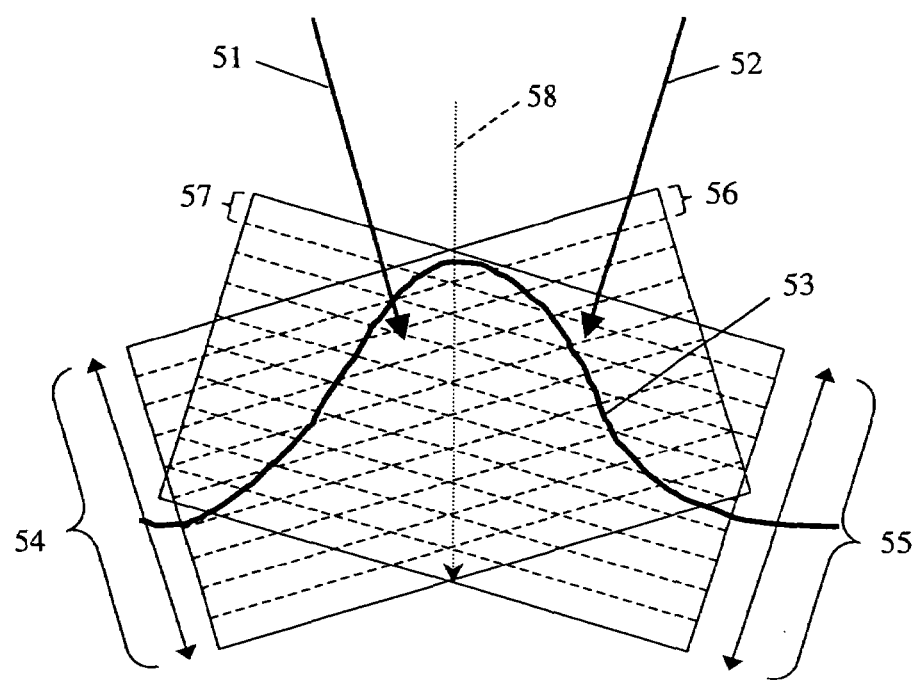
FIG. 5 is a typical illustration viewed from the sectional direction of a sample, as to the formation of an image in a stereoscopic view using the focal depth expanding function.
Figure 6:
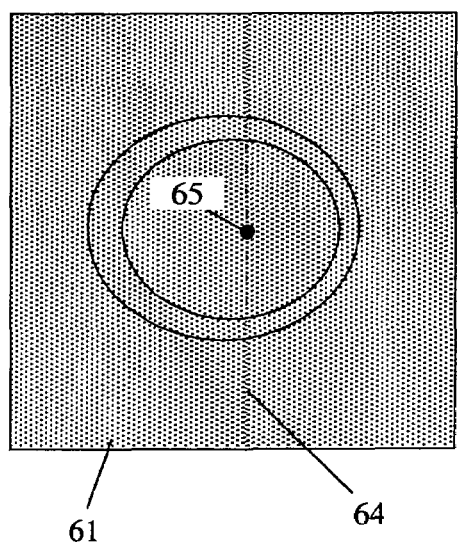
Figure 6:
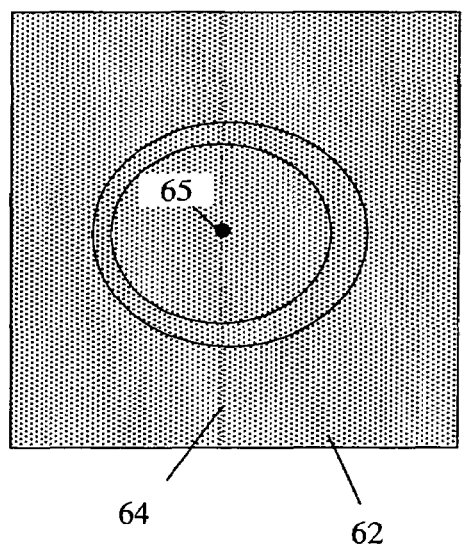

The stereoscopic image attained by the focal depth expanding function will be described with FIG. 5, FIG. 6A, and FIG. 6B. FIG. 5 is an explanatory chart viewed from the sectional direction of a sample, which typically illustrates the formation of an image in viewing the SEM image stereoscopically by using the focal depth expanding function. FIG. 6 illustrates images when the images are viewed stereoscopically by using the focal depth expanding function, in which FIG. 6A illustrates a focal depth expanded image by the SEM when the sample or the incident electron is tilted by +θ degree, and FIG. 6B illustrates a focal depth expanded image by the SEM when the sample or the incident electron is tilted by −θ degree.

When irradiating a +θ tilted incident electron 51 to a sample 53, the method attains an image 61 on the monitor of the SEM as illustrated in FIG. 6A. Owing to the focal depth expanding function, a focal depth 54 is confirmed to be deeper than a focal depth 56 when the focal depth expanding function is not used. And, when irradiating a −θ tilted incident electron 52 to the sample 53, the method attains an image 62 on the monitor of the SEM as illustrated in FIG. 6B. Also in this case, owing to the focal depth expanding function, a focal depth 55 is confirmed to be deeper than a focal depth 57 when the focal depth expanding function is not used. In this manner, both of the focal-depth-expanded image 61 by the SEM when the sample or the incident electron is tilted by +θ degree and the focal-depth-expanded image 62 by the SEM when the sample or the incident electron is tilted by −θ degree are confirmed to be in focus substantially on the whole image. To synthesize these two sheets of the images 61, 62 and make a stereoscopic display will achieve a stereoscopic image being in focus on the whole image, and an image giving more stereognostic sense.

Figure 7:
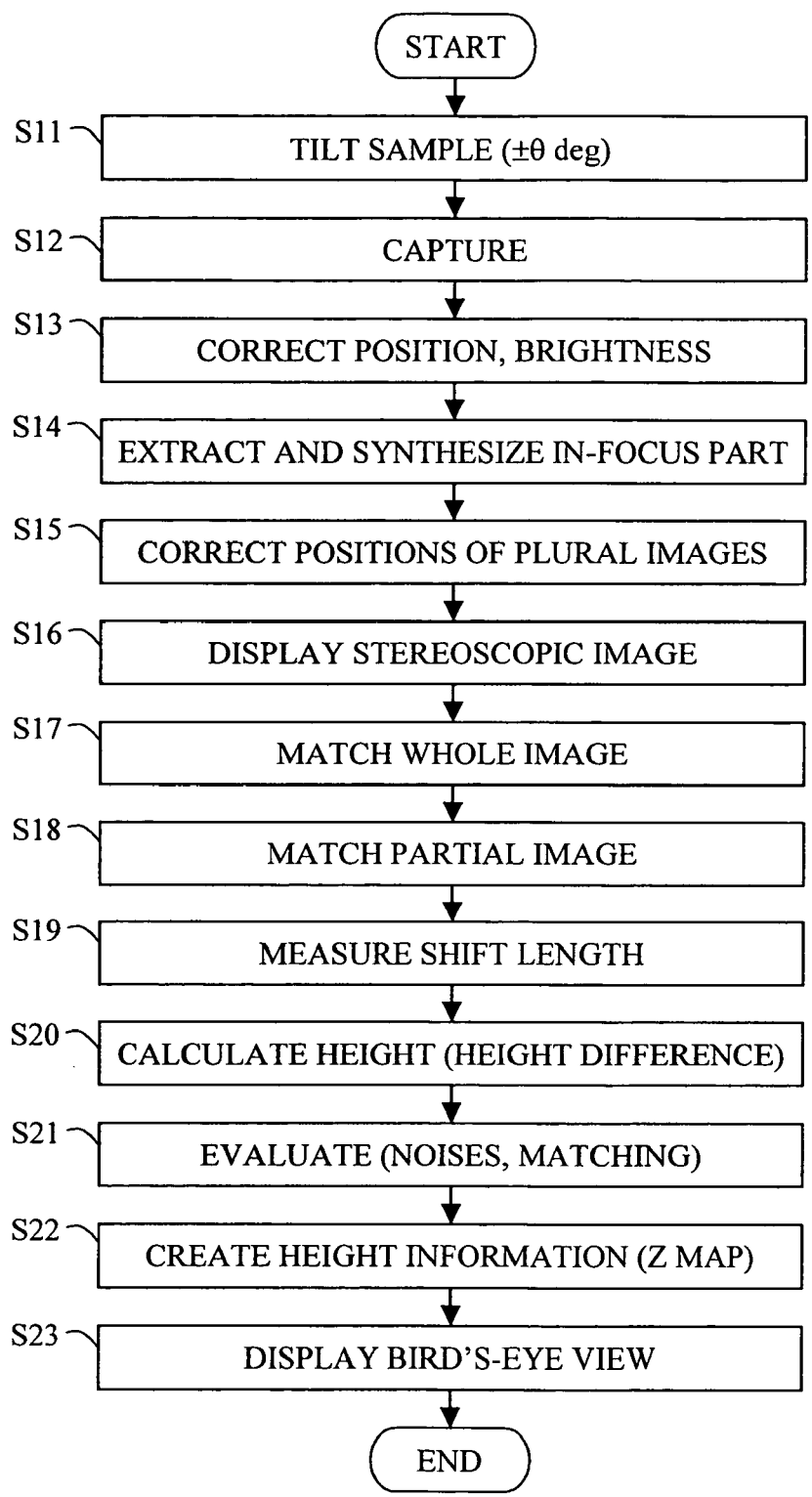
FIG. 7 is a flow chart illustrating the procedure of capturing, synthesizing, and measuring images.

FIG. 7 is a flow chart illustrating the procedure of capturing, synthesizing, and measuring images.

First, step S11 tilts the sample or the beam incident direction by ±θ degree, and step S12 captures images from the two directions by using the focal depth expanding function. Next, step S13 automatically performs the position correction and brightness correction of the captured images. And, step S14 extracts only the in-focus parts of the corrected images and synthesizes them. These steps can be carried out automatically by using the focal depth expanding function. Next, step S15 performs the position correction (adjusting the tilt center) of the two sheets of images captured by tilting the direction by ±θ degree and using the focal depth expanding function, and step S16 gives a stereoscopic display.

In observing a stereoscopic image, it is a general practice to set the tilt center near the center of the SEM image observation domain (or to move the sample structure desirably set to the tilt center to the field-of-view center), and then to capture the first sheet of the image. Here, the tilt center is the point of reference for correcting the displacement of a tilted image. After the first sheet of the image is captured, the sample or the electron beam is tilted; and at this moment, the field of view is moved by driving the stage or by shifting the beam so that the tilt center does not shift to the first sheet of the captured image. In FIG. 15, FIG. 16A, FIG. 16B, FIG. 5, FIG. 6A, and FIG. 6B, the numerical symbols 156, 165, 58, and 64 represent the sample tilt axis, and 166 and 65 the tilt center.

Next, step S17 performs the whole matching to the two sheets of images of different tilt angles captured by using the focal depth expanding function, detects the tilt centers between the two sheets of the images, and makes them coincident. Following this, step S18 performs the partial matching to a local image with one pixel as the center, between the two sheets of the images with the tilt centers coincident, and step S19 measures the shift length of the pixel between the two sheets of the images with the tilt centers coincident. Step S20 calculates the height (h) by each pixel, using the shift length of the pixel (Δ=A−A'), the tilt angle (2θ), and the following expression (2).

$$\tan \theta = \Delta/h \qquad (2)$$

Step S22 executes the above calculation to all the pixels over the whole domain of the image, and creates a height information map (Z map) by each pixel.

The shift length of a small domain having one pixel on the center between two sheets of images can be calculated, for example, by correlating the images. The image correlation processing is a technique that numerically expresses as the similarity the degree to which two local images are similar each other by a certain evaluation criteria; and when the two images are in the maximum similarity, the similarity=1.0 is given.

Figure 8:
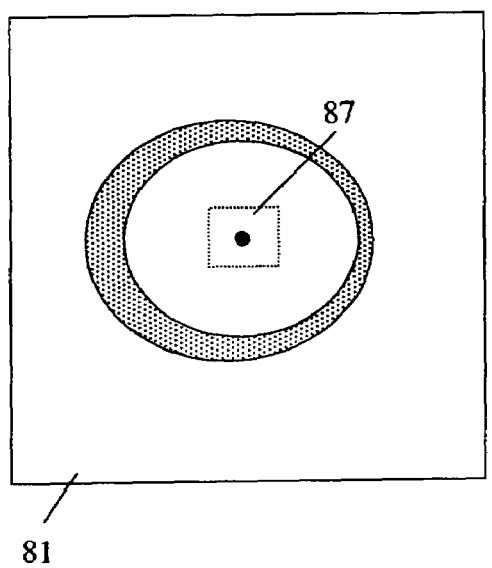
FIG. 8 is a typical chart of the automatic searching process of a corresponding point by the image correlation.
Figure 8:
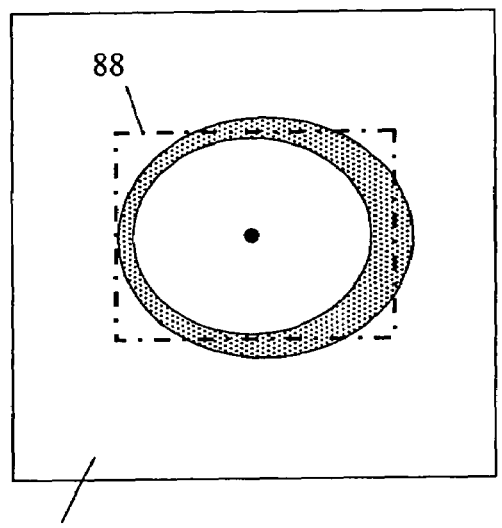
Figure 8:
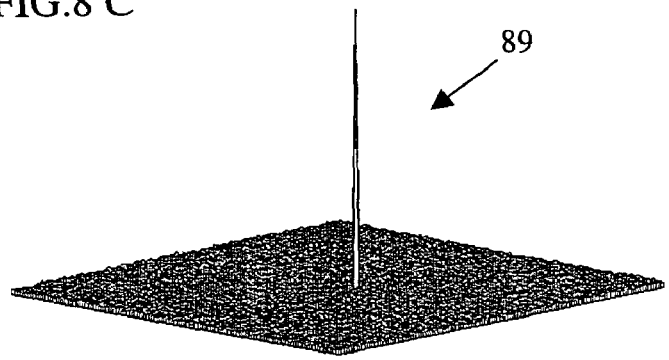

The method of calculating the image correlation between two images 81, 82 will be described with FIG. 8. First, the method sets to the one image 81 a small frame 87 having a pixel on the center, of which shift length is to be calculated; and sets to the other image 82 a comparably large frame 88. The frame 88 set in the image 82 is to include the same part as the small frame 87 of the image 81. Now, while moving the small frame 87 minutely one pixel by one pixel in the frame 88, and placing the same frame as the small frame, and each time of placing it, the method calculates the similarity of the images of small frames between the images 81, 82 by the correlation, and records the calculated values of the similarity as a map, as shown by 89 in FIG. 8C. The point giving the maximum similarity in the frame 88 is regarded as the same point. Executing the above calculation using a computer will automatically give the position of pixel in the image 82 corresponding to the center pixel of the small frame 87 in the image 81. Continuously executing this processing in the measurement domain will automatically give the shift length of the corresponding pixels in the two images 81, 82, and applying the calculated result to the above expressing (2) will give the height of each pixel.

With regard to the calculated value of the height, step S21 executes the evaluation of noises and matching errors as needed. Completing all these steps, step S22 creates the height information map (Z map) by each pixel. The Z map enables to display the height difference between arbitrary two points and the height distribution along an arbitrary straight line, and so forth. The Z map also allows displaying a stereoscopic image as a bird's-eye view (S23).

FIG. 9 typically illustrates an example of the Z map. Each square in the drawing corresponds to the position of a pixel on the image, and the value $h_{ij}$ filled in the square represents the height of the sample in the pixel.

Figure 10:
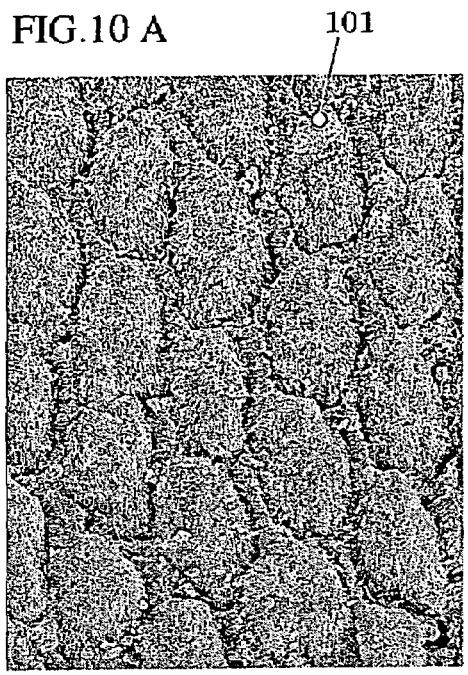
Figure 10:
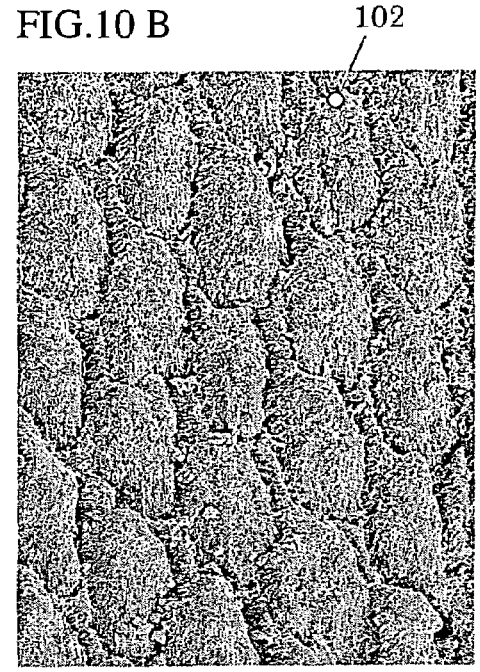
Figure 10:
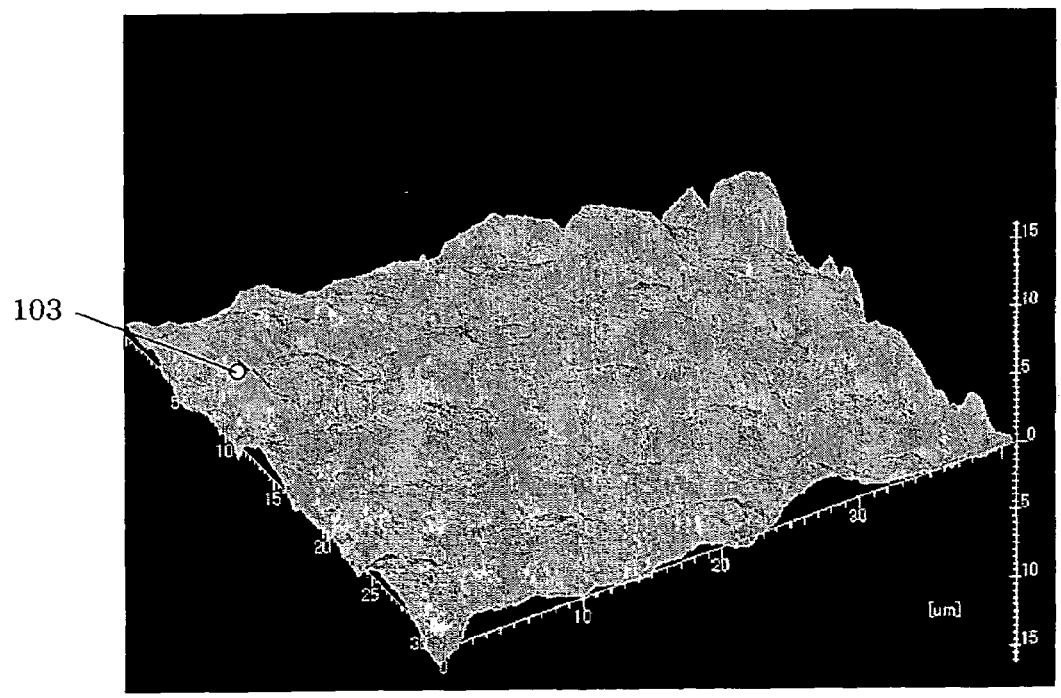

FIG. 10 illustrates an example of the bird's-eye view created on the basis of a Z map. FIG. 10A illustrates an image attained by tilting the sample by +θ degree and using the focal depth expanding function, and FIG. 10B illustrates an image attained by tilting the sample by −θ degree and using the focal depth expanding function. Displaying these two sheets of images in a stereoscopic view and calculating the height of the whole image by each pixel will attain a Z map as illustrated in FIG. 9. To display the height information three-dimensionally according to the Z map will attain a bird's-eye view illustrated in FIG. 10C. FIG. 10C illustrates an image attained by rotating the three-dimensional map created from the images of FIG. 10A and FIG. 10B by 90°. The point 103 in FIG. 10C corresponds to the point 101 in FIG. 10A and the point 102 in FIG. 10B.

Figure 11:
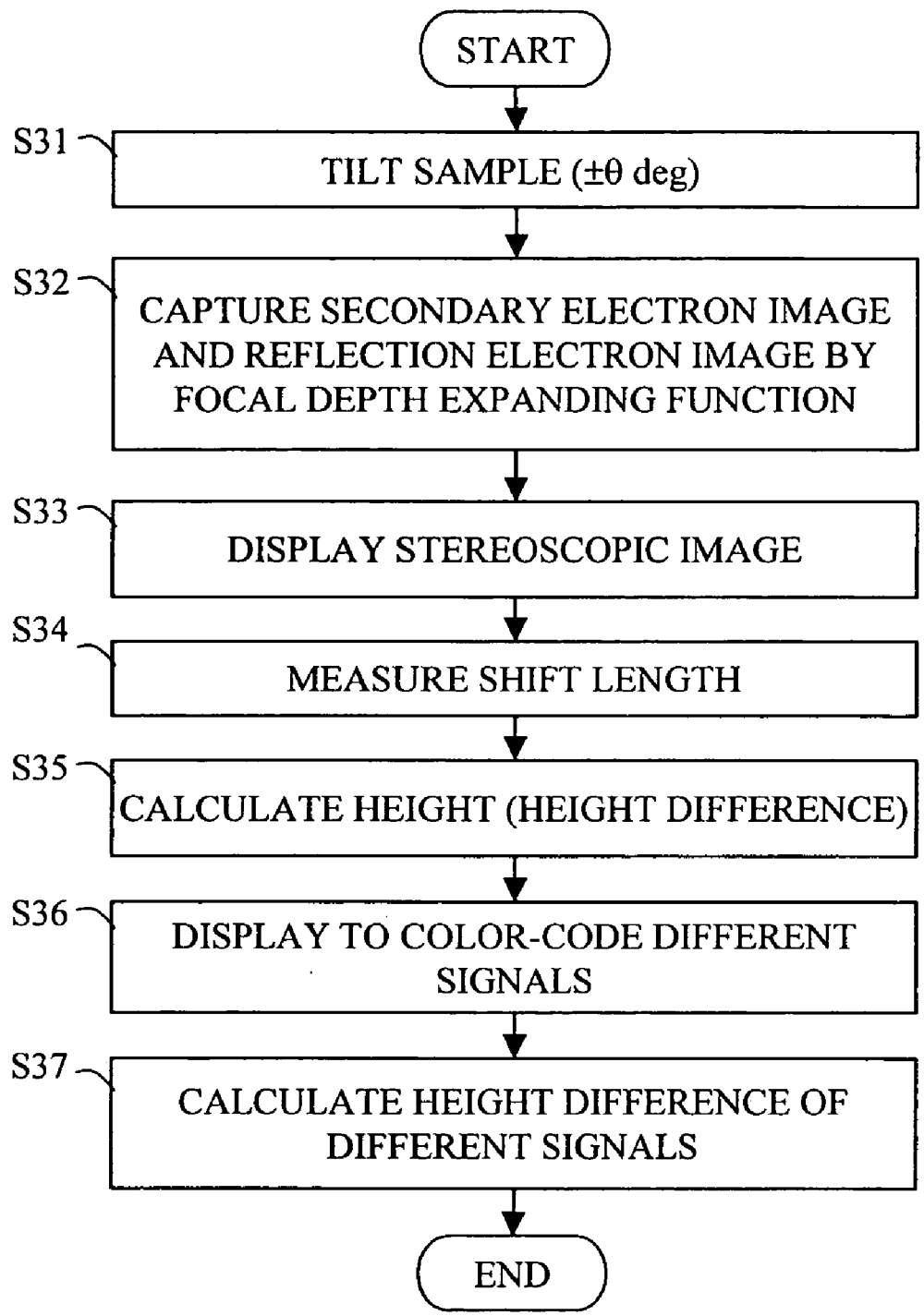
FIG. 11 is a flow chart illustrating a procedure of measuring a height difference between objects given by different signals.
Figure 13:
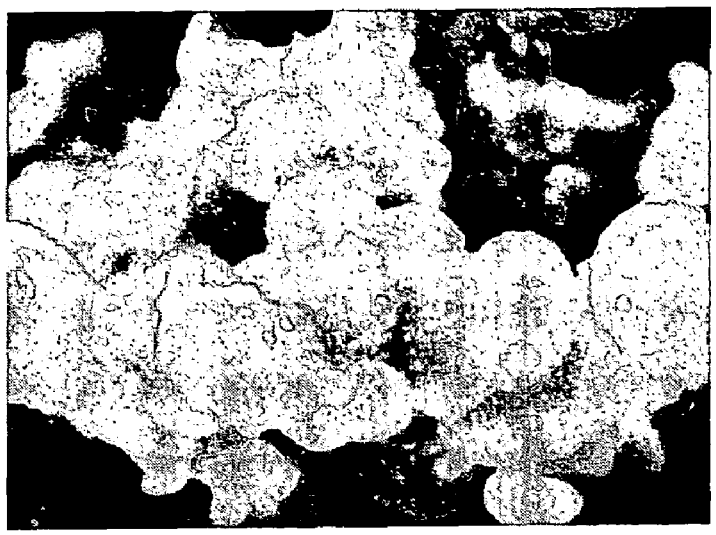
Figure 13:
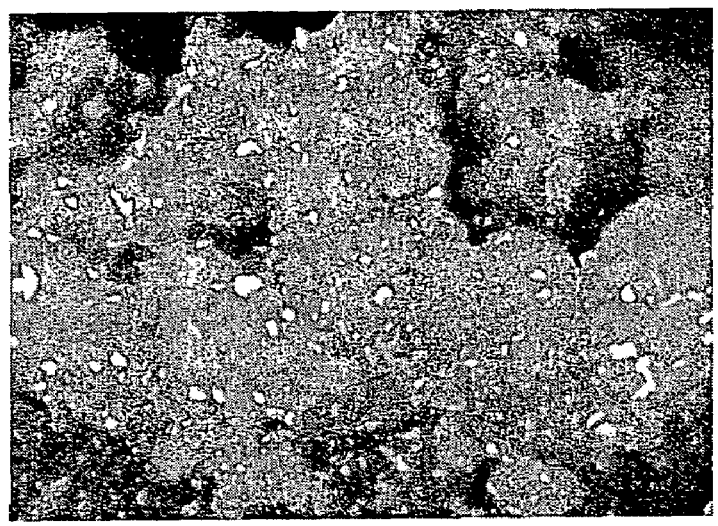
Figure 13:
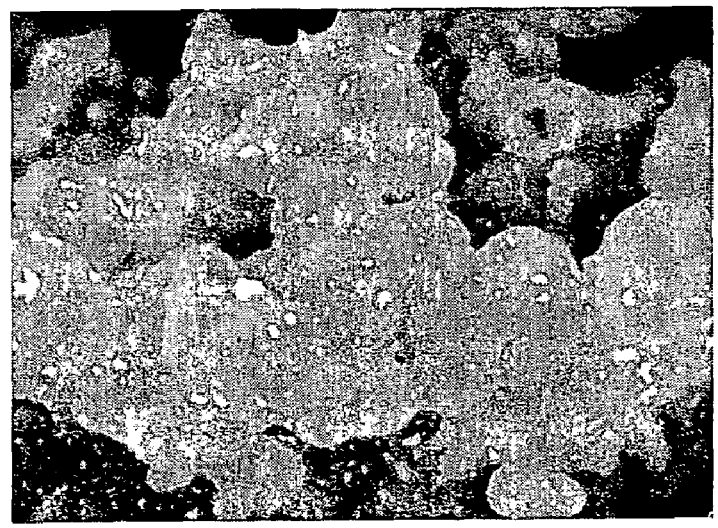

According to this invention, using the dimensions in the height direction each measured from plural pairs of signals will make it possible to measure the dimensional differences in the height direction between the objects displayed by different signals. This method will be explained with the flow chart in FIG. 11 and FIG. 13. Here, for simplifying the explanation, it is assumed that one signal to be detected is the secondary electron and the other is the reflected electron; however, any number of pairs of signals except for those can be applied to this method.

First, step S31 tilts the sample or the beam incident direction by ±θ degree, and step S32 captures a secondary electron image from the two directions by using the focal depth expanding function. Here, tilting the sample or the beam incident direction by ±□ degree in the same manner, step S32 captures a reflection electron image from the two directions by using the focal depth expanding function. The secondary electron image and reflection electron image may be captured at the same time. The position correction and brightness correction of the captured images are automatically carried out, and only the in-focus parts of the corrected images are extracted and synthesized. These steps can be carried out automatically by using the focal depth expanding function.

Next, step S33 performs the position correction (adjusting the tilt center) of the two pairs of images captured by tilting the direction by ±θ degree and using the focal depth expanding function, with regard to the secondary electron image and the reflection electron image each. Next, step S34 measures the shift length by each pixel between the two sheets of images captured by tilting the direction by ±θ degree and using the focal depth expanding function, with regard to the secondary electron image and the reflection electron image each. Next, Step S35 calculates the height by each pixel from the measured shift length by each pixel and the tilt angle. Completing these steps will attain a Z map $a_{ij}$ of the secondary electron image as shown in FIG. 12A, and a Z map $b_{ij}$ of the reflection electron image as shown in FIG. 12B. In case of simultaneously capturing different types of signal images, the position correction of the two Z maps is unnecessary. However, in case of capturing different types of signal images separately and synthesizing them, the position adjustment of the two Z maps may be carried out by using the image correlation, or by designating through manual input from the images.

Further, subtracting the heights of corresponding pixels of the Z map of the secondary electron image and the Z map of the reflection electron image, step S36 calculates the difference in the height direction between the objects presented by different signals, and creates a Z map $c_{ij}$ ($C_{ij} = a_{ij} - b_{ij}$) containing the information of difference in the height direction, as shown in FIG. 12C. Based on the Z map of the secondary electron image and the Z map of the reflection electron image, step S37 displays to color-code and superpose the secondary electron image and the reflection electron image each, of which heights are calculated.

According to this method, it is possible to display a stereoscopic image with both the surface information by the secondary electrons and the composition information by the reflection electrons (electron signals emitted from the inside of the sample). It is also possible to quantitatively measure the depth from the surface observed by the secondary electron signals, the position at which the composition information by the reflection electrons exists.

An example will be explained with FIGS. 13A, 13B, and 13C, in which this method is applied to an observation of platinum catalyst particles (Pt/C), which are used for the cleaning processing of exhaust gases from vehicles and the electrodes of fuel batteries, and so forth. FIG. 13A illustrates a stereoscopic image created from a focal-depth-expanded image in the secondary electron mode of the sample, FIG. 13B a stereoscopic image created from a focal-depth-expanded image in the reflection electron mode of the sample at the same position, and FIG. 13C a stereoscopic image having the two images superposed. Here, since these images are displayed on a paper, they are displayed as plane images on these drawings.

The platinum catalyst particles (Pt/C) carry extremely fine particles of platinum less than some nanometers on the carbon complex (or spongy structure) of fine particles less than some 10 nanometers. The secondary electron mode gives a clear observation to the surface shape of the carbon particles, and the reflection electron mode gives a clear observation to the dispersed state of platinum particles of the grain diameter less than about 10 nanometers. In this manner, to superpose the stereoscopic images created from the focal-depth-expanded images of different signals captured in the same field of view will make it possible to swiftly evaluate the surface state of the carbon particles and the dispersed state of the platinum particles. The superposition of the images may use a same color, or may arrange a specific color to each of the images. The image to be synthesized is not limited to the secondary electron image and the reflection electron image, and more than three sheets of images may be synthesized. Using the focal-depth-expanded image such as an X-ray analysis image (mapping image) will attain a three-dimensional distribution by each chemical element.

Figure 14:
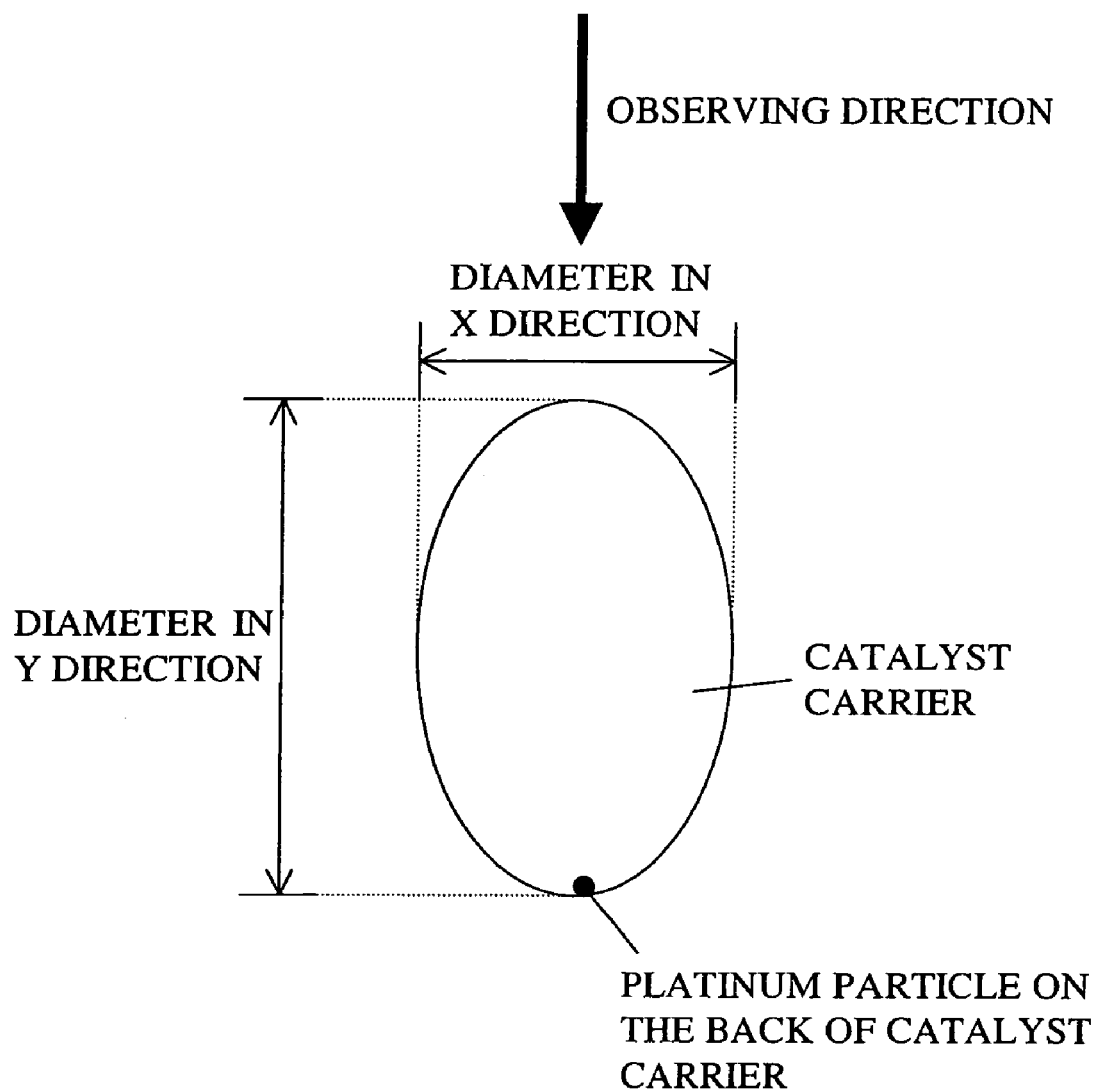
FIG. 14 is an explanatory chart illustrating an idea capable of knowing the diameter in the Y-direction of a catalyst carrier.
Figure 15:
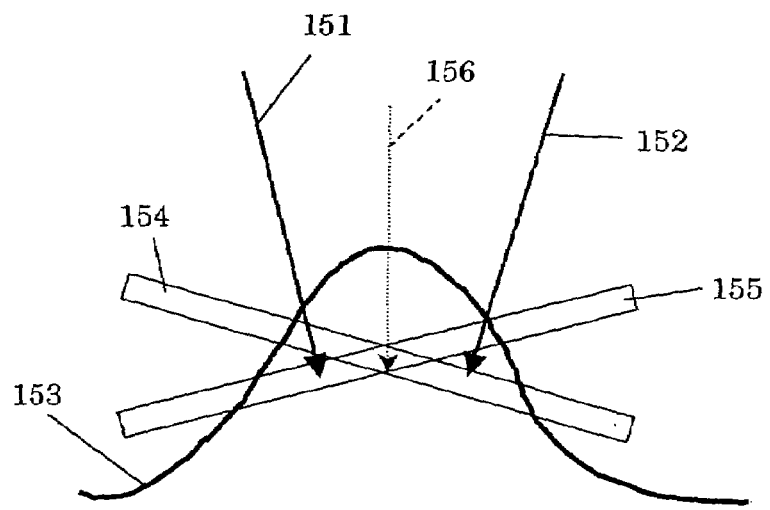
FIG. 15 is a chart typically illustrating the formation of an image in a stereoscopic view, viewed from the sectional direction of a sample.
Figure 16:
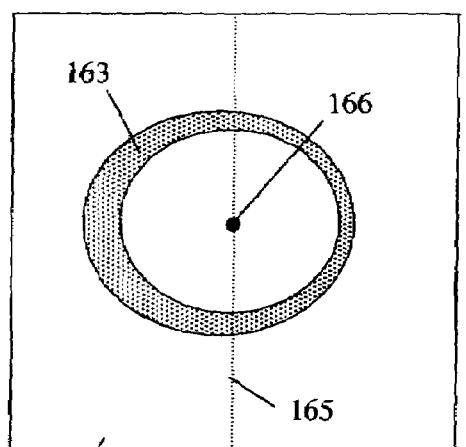
Figure 16:
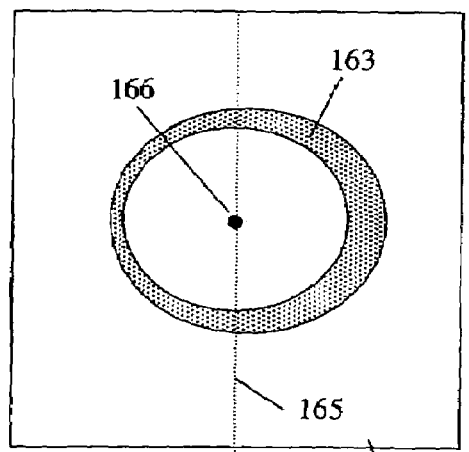

According to this invention, in case of a sample composed of substances with a large difference of atomic numbers such as the catalyst for the fuel battery of this example, it is possible to measure the distance from the uppermost surface of the catalyst carrier (carbon) to the platinum particle lying on the backside of the catalyst carrier. That is, as shown in FIG. 14, the X-direction diameter of the catalyst carrier can be measured only from the uppermost information of the catalyst carrier, however the Y-direction diameter of the catalyst carrier can also be attained by measuring the distance to the platinum particle lying on the backside of the catalyst carrier.

According to this invention, the area giving a stereoscopic view can be expanded, the three-dimensional shape can be attained in a wider range, and the height (height difference) can be calculated from the whole domain of the image, whereby the three-dimensional image can be displayed as a bird's-eye view. Also, by displaying to color-code and superpose plural three-dimensional bird's-eye views derived from different secondary signals, the difference in the height direction between objects displayed by the different signals can easily be attained.

What is claimed is:

1. A sample observation method comprising the steps of:
   irradiating an electron beam to a sample at a first incident angle, and detecting a secondary signal emitted from the sample to acquire a scanning electron microscope image of the sample;
   repeating the step while varying a focus to acquire a plurality of scanning electron microscope images at the first incident angle;
   irradiating an electron beam to the sample at a second incident angle different from the first incident angle, and detecting a secondary signal emitted from the sample in order to acquire a scanning electron microscope image of the sample;
   repeating the step while varying a focus to acquire a plurality of scanning electron microscope images at the second incident angle;
   extracting from the multiple scanning electron microscope images acquired at the first incident angle image domains that are in focus and generating a first composed image;
   extracting from the multiple scanning electron microscope images acquired at the second incident angle image domains that are in focus, and generating a second composed image; and
   matching the first composed image with the second composed image, detecting the center of tilting of each of the two-composed images, causing the centers of tilting to be aligned with each other, and observing a stereoscopic view from the two composed images.

2. A sample observation method using a scanning electron microscope, comprising the steps of:
   irradiating an electron beam to a sample at a first incident angle, and detecting a secondary signal emitted from the sample to capture a scanning electron microscope image of the sample;
   repeating the step while varying a focus in a step-wise manner, and capturing a plurality of scanning electron microscope images at the first incident angle;
   irradiating the electron beam to the sample at a second incident angle different from the first incident angle, and detecting a secondary signal emitted from the sample to capture a scanning electron microscope image of the sample;
   repeating the step while varying a focus in a step-wise manner, and capturing a plurality of scanning electron microscope images at the second incident angle;
   extracting in-focus image domains from each of the plurality of scanning electron microscope images captured at the first incident angle, and creating a first all in-focus image being in focus over the first all in-focus image;
   extracting in-focus image domains from each of the plurality of scanning electron microscope images captured at the second incident angle, and creating a second all in-focus image being in focus over the second all in-focus image;
   calculating a distance between corresponding two pixels in the first all in-focus image and the second all in-focus image;
   calculating height information by each pixel on the basis of the distance between corresponding two pixels and a difference of angle between the first incident angle and the second incident angle; and
   creating a height map on the basis of the height information by each pixel.

3. A sample observation method as claimed in claim 2, further comprising a step of creating a three-dimensional bird's-eye view from the height map.

4. A sample observation method comprising the steps of:
   irradiating an electron beam to a sample at a first incident angle, and detecting first and second secondary signals emitted from the sample to acquire a scanning electron microscope image of the sample based on the first secondary signal and a scanning electron microscope image of the sample based on the second secondary signal;
   repeating the step while varying a focus to acquire a plurality of scanning electron microscope images at the first incident angle;
   irradiating an electron beam to the sample at a second incident angle different from the first incident angle, and detecting first and second secondary signals emitted from the sample in order to acquire a scanning electron microscope image of the sample based on the first secondary signal and a scanning electron microscope image of the sample based on the second secondary signal;
   repeating the step while varying a focus to acquire a plurality of scanning electron microscope images based on the first secondary signal and a plurality of scanning electron microscope images based on the second secondary signal, at the second incident angle;
   extracting in-focus image domains from each of the plurality of scanning electron microscope images based on the first secondary signal, captured at the first incident angle, and generating a first all in-focus image being in focus over the first all in-focus image;
   extracting in-focus image domains from each of the plurality of scanning electron microscope images based on the second secondary signal, captured at the first incident angle, and creating a second all in-focus image being in focus over the second all in-focus image;
   extracting in-focus image domains from each of the plurality of scanning electron microscope images based on the first secondary signal, captured at the second incident angle, and creating a third all in-focus image being in focus over the third all in-focus image; and
   extracting in-focus image domains from each of the plurality of scanning electron microscope images based on the second secondary signal, captured at the second incident angle, and creating a fourth all in-focus image being in focus over the fourth all in-focus image.

5. A sample observation method as claimed in claim 4, further comprising a step of displaying the first all in-focus image and the third all in-focus image with a first color, displaying the second all-in focus image and the fourth all in-focus image with a second color, and observing a stereoscopic image.

6. A sample observation method as claimed in claim 4, further comprising the steps of:
   calculating a distance between corresponding two pixels in the first all in-focus image and the third all in-focus image;
   calculating height information of the sample based on the first secondary signal by each pixel, on the basis of the distance between corresponding two pixels in the first all in-focus image and the third all in-focus image and a difference of angle between the first incident angle and the second incident angle;
   creating a first height map on the basis of the height information of the sample based on the first secondary signal by each pixel;

calculating a distance between corresponding two pixels in the second all in-focus image and the fourth all in-focus image;

calculating height information of the sample based on the second secondary signal by each pixel, on the basis of the distance between corresponding two pixels in the second all in-focus image and the fourth all in-focus image and the difference of angle between the first incident angle and the second incident angle; and creating a second height map on the basis of the height information of the sample based on the second secondary signal by each pixel.

7. A sample observation method as claimed in claim 6, further comprising the steps of:

creating a first three-dimensional bird's-eye view with a first display color from the first height map;

creating a second three-dimensional bird's-eye view with a second display color different from the first display color from the second height map; and displaying to superpose the first three-dimensional bird's-eye view and the second three-dimensional bird's-eye view.

8. A sample observation method as claimed in claim 6, further comprising a step of calculating a difference of height by each of corresponding pixels in the first height map and the second height map.

9. A sample observation method as claimed in any of claims 1 through 8, wherein the first incident angle and/or the second incident angle are set by using the deflection action occurring when passing an electron beam off the center of an objective lens of the scanning electron microscope.

10. A scanning electron microscope, comprising:

an electron beam source;

an electro-optic system that scans to converge a primary electron beam emitted from the electron beam source on a sample, including an objective lens;

an incident angle control means that controls an incident angle of the primary electron beam irradiated on the sample;

a detector that detects a secondary signal emitted from the sample by the primary electron beam being irradiated on the sample;

an all in-focus image processing means that extracts in-focus image domains from each of a plurality of sample images of different focuses of the primary electron beam, and creates an all in-focus image being in focus over the all in-focus image; and a calculation means that calculates height information of the sample by each pixel, on the basis of two all in-focus images created by the all in-focus image processing means at two different incident angles set by the incident angle control means, from the plurality of sample images of different focuses of the primary electron beam each captured at the two different incident angles.

11. A scanning electron microscope as claimed in claim 10, wherein the incident angle control means includes a deflection means that deflects the primary electron beam at an objective point of the objective lens to make the electron beam fall on off the center of the objective lens.

12. A scanning electron microscope as claimed in claim 10 or claim 11, further comprising an image display means that displays images, and a means that creates a three-dimensional bird's-eye view from the height information of the sample calculated by the calculation means, wherein a created three-dimensional bird's-eye view is displayed on the image display means.

13. A scanning electron microscope as claimed in claim 10 or claim 11, further comprising a first detector that detects a first secondary signal and a second detector that detects a second secondary signal as the detector, wherein the calculation means calculates height information of the sample based on the first secondary signal and height information of the sample based on the second secondary signal.

14. A scanning electron microscope as claimed in claim 13, wherein the first detector is a secondary electron detector, and the second detector is a reflection electron detector.

15. A scanning electron microscope as claimed in claim 13 or claim 14, further comprising an image display means that displays images, and a means that creates a three-dimensional bird's-eye view from the height information of the sample calculated by the calculation means, wherein a first three-dimensional bird's-eye view created from the height information of the sample based on the first secondary signal and a second three-dimensional bird's-eye view created from the height information of the sample based on the second secondary signal are displayed on the display means.

16. A scanning electron microscope as claimed in claim 15, wherein the first three-dimensional bird's-eye view and the second three-dimensional bird's-eye view are displayed with different colors.

* * * * *